(12) United States Patent
Da Silva et al.

(10) Patent No.: US 7,688,103 B2
(45) Date of Patent: *Mar. 30, 2010

(54) CELL WITH FIXED OUTPUT VOLTAGE FOR INTEGRATED CIRCUIT

(75) Inventors: Patrick Da Silva, Antibes (FR); Laurent Souef, Montauroux (FR)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/262,912

(22) Filed: Oct. 31, 2008

(65) Prior Publication Data

US 2009/0051385 A1    Feb. 26, 2009

Related U.S. Application Data

(62) Division of application No. 10/514,902, filed as application No. PCT/IB03/02077 on May 15, 2003, now Pat. No. 7,459,928.

(30) Foreign Application Priority Data

May 22, 2002    (FR)    ................... 02 06227

(51) Int. Cl.
*H03K 19/00*    (2006.01)

(52) U.S. Cl. .............................. 326/16; 326/9; 326/12
(58) Field of Classification Search ..................... 326/9, 326/12, 16, 93
See application file for complete search history.

(56) References Cited

U.S. PATENT DOCUMENTS

| 4,870,345 A | 9/1989 | Tomioka et al. |
| 5,099,501 A | 3/1992 | Sarkoezi |
| 5,444,404 A | 8/1995 | Emzery |
| 5,574,853 A | 11/1996 | Barch et al. |
| 6,014,762 A * | 1/2000 | Sanghani et al. ............ 714/718 |
| 6,119,256 A | 9/2000 | Muris et al. |
| 6,456,113 B2 | 9/2002 | Kanba |

* cited by examiner

*Primary Examiner*—Anh Q Tran

(57) ABSTRACT

The invention relates to a testable integrated circuit. In order to replace ground and VDD in certain points of such a circuit, the circuit comprises a cell (34) which comprises a flipflop (11) and means (31) able to set the output voltage of the cell when the circuit is in the operation mode. These means for setting the output voltage are controlled by a control signal (15) which depends on the mode signal that indicates whether the signal is in the test mode or in the operation mode.

9 Claims, 5 Drawing Sheets

CELL WITH FIXED OUTPUT VOLTAGE FOR INTEGRATED CIRCUIT

FIELD OF THE INVENTION

The present invention relates to the domain of testable integrated circuits in which certain points are connected to ground or a fixed voltage when the circuit is in the operation mode.

BACKGROUND OF THE INVENTION

In most integrated circuits certain points of the circuit are to remain at a fixed voltage when the circuit operates. For example, certain points of the circuit are frequently to be connected "to ground" or "to VDD", which means that these points have a voltage equal to zero or five volts, for example, respectively. Such points present the drawback of being sensitive to electrostatic discharges which have the risk of damaging the integrated circuit. Moreover, such points cannot be tested because they have a fixed voltage even when the circuit is in the test mode. This brings in the disadvantage of diminishing a test cover ratio during a test step of the integrated circuit.

In order to mitigate these disadvantages, these points are replaced by cells which deliver a fixed output voltage when the integrated circuit is in the operation mode. These cells comprise a flipflop which may thus be integrated with a test chain during a test step. When the circuit is in the test mode, it is possible to make the output voltage of this cell vary. Consequently, by virtue of the cells, the points that have a fixed voltage in the operation mode may be tested in the test mode. So this permits to increase the test cover ratio. Moreover, such flipflops are not very sensitive to electrostatic discharges. This diminishes the risks of damaging the integrated circuit by such discharges.

The cell marketed by the applicants under reference CMOS18 is an example of such a cell. This cell comprises a flipflop which has two outputs and is activated by a clock. This flipflop receives a signal which indicates whether the circuit is in the test mode or in the operation mode. In the operation mode, when the clock is active, one of the outputs of the flipflop has a fixed positive voltage, the other a zero voltage. Consequently, while taking one of the two outputs of this flipflop as the output of the cell, this cell can replace ground or the voltage VDD at certain points of the integrated circuit.

A disadvantage of such a cell resides in the fact that for obtaining a fixed output voltage in the operation mode, the cell is constantly to be activated by a clock while the circuit is in the operation mode. This brings with it a considerable current consumption. In certain applications the current consumption is a critical data. This is the case notably in portable applications operating on a battery such as a portable telephone.

SUMMARY OF THE INVENTION

It is an object of the invention to reduce the current consumption in an integrated circuit.

This object is achieved by virtue of a first object of the invention relating to an integrated circuit comprising a cell that has an output with a fixed output voltage when the integrated circuit is in the operation mode, said cell comprising a flipflop and means for setting the output voltage when the circuit is in the operation mode, said means being controlled by a control signal which depends on a mode signal that indicates whether the circuit is in the operation mode or in the test mode.

The invention benefits from the fact that in the operation mode the prior-art flipflop does not play a sequential role. However, in the test mode the flipflop does play a sequential role because it is notably integrated with a shift register. Consequently, the clock cannot be eliminated when the circuit is in the test mode, but the clock can be eliminated when the circuit is in the operation mode, the flipflop then not playing any sequential role.

According to the invention the clock does not have to be active for the flipflop when the integrated circuit is in the operation mode, because the output voltage is then controlled by a control signal that is independent of said clock. This control signal may be, for example, the mode signal. This is fixed when the circuit is in the operation mode. Thus the output voltage is fixed when the circuit is in the operation mode.

As the clock is not active for the flipflop, the power consumption of a cell is thus reduced when the circuit is in the operation mode. In consequence, the power consumption of the integrated circuit is reduced.

In a first embodiment of the first object of the invention the flipflop is a D-type flipflop having an input connected to an output and asynchronous reset-to-zero means or asynchronous set-to-one means controlled by the control signal, the output of the flipflop corresponding to the output of the cell.

According to this embodiment the control signal is an initialization signal. This initialization signal permits if the flipflop comprises asynchronous reset-to-zero means, to let the output voltage go to zero. When the circuit changes to the operation mode, this initialization signal is sent to the flipflop. The sending of the signal may be commanded by a processor which manages the changes of the circuit from a test mode to an operation mode. Thus, the initialization signal is sent when the mode signal varies. The initialization signal thus depends on the mode signal. Consequently, the expression "the control signal depends on the mode signal" is understood to mean that the control signal may be equal to the mode signal or derived from the mode signal by virtue of, for example, a processor.

When the reset-to-zero means of the flipflop receive the initialization signal, the output of the flipflop changes to a zero voltage. Then, as long as the circuit is in the operation mode, the output of the flipflop remains zero as will be seen hereinafter. This is independent of the clock which the flipflop receives. Consequently, when the circuit is in the operation mode, the clock can be deactivated at the level of the flipflop. If one wishes to obtain the voltage VDD at the output of the cell, an asynchronous flipflop having set-to-one means is taken.

In a second embodiment of the first object of the invention the cell further includes a logic circuit having a first input connected to the output of the flipflop, a second input controlled by the mode signal and an output corresponding to the output of the cell, said logic circuit being able to deliver on its output a voltage as a function of said mode signal when the circuit is in the operation mode.

According to this embodiment the control signal is the mode signal which indicates whether the circuit is in the operation mode or in the test mode. This signal is present in all the testable circuits. Consequently, this second advantageous embodiment of the invention may be utilized in all the testable integrated circuits. The mode signal is equal to, for example, VDD when the circuit is in the test mode, and zero when the circuit is in the operation mode. The logic circuit connected to the flipflop delivers a voltage that does not depend on the output of the flipflop but solely on the mode signal when the circuit is in the operation mode. Consequently, when the circuit is in the operation mode, the clock may be deactivated at the level of the flipflop.

A second object of the invention relates to an integrated circuit comprising a first cell which has an output with a fixed output voltage when the integrated circuit is in the operation mode and a second cell comprising a flipflop and a logic circuit, said logic circuit having a first input connected to an output of the flipflop, a second input connected to the output of the first cell and an output corresponding to the output of the second cell and being able to deliver on its output a voltage as a function of the output voltage of the first cell when the circuit is in the operation mode.

Such a circuit can be tested better than a circuit comprising cells according to the second embodiment of the first object of the invention. Actually, in a circuit comprising cells according to the second embodiment of the first object of the invention, the second inputs of the logic circuits of the cells cannot be tested. In effect, their voltage is equal to the mode signal when the circuit is in the test mode. When a voltage of a point cannot vary when the circuit is in the test mode, this point cannot be tested.

In contrast, in a circuit as defined above, the second input of the logic circuit of the second cell can be tested, because its voltage is equal to the output voltage of the first cell which may vary when the circuit is in the test mode. The first cell may be, for example, a cell according to the second embodiment of the first object of the invention. In this case the integrated circuit has only one point that cannot be tested which is the second input of the logic circuit of the first cell.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

Figure 1:
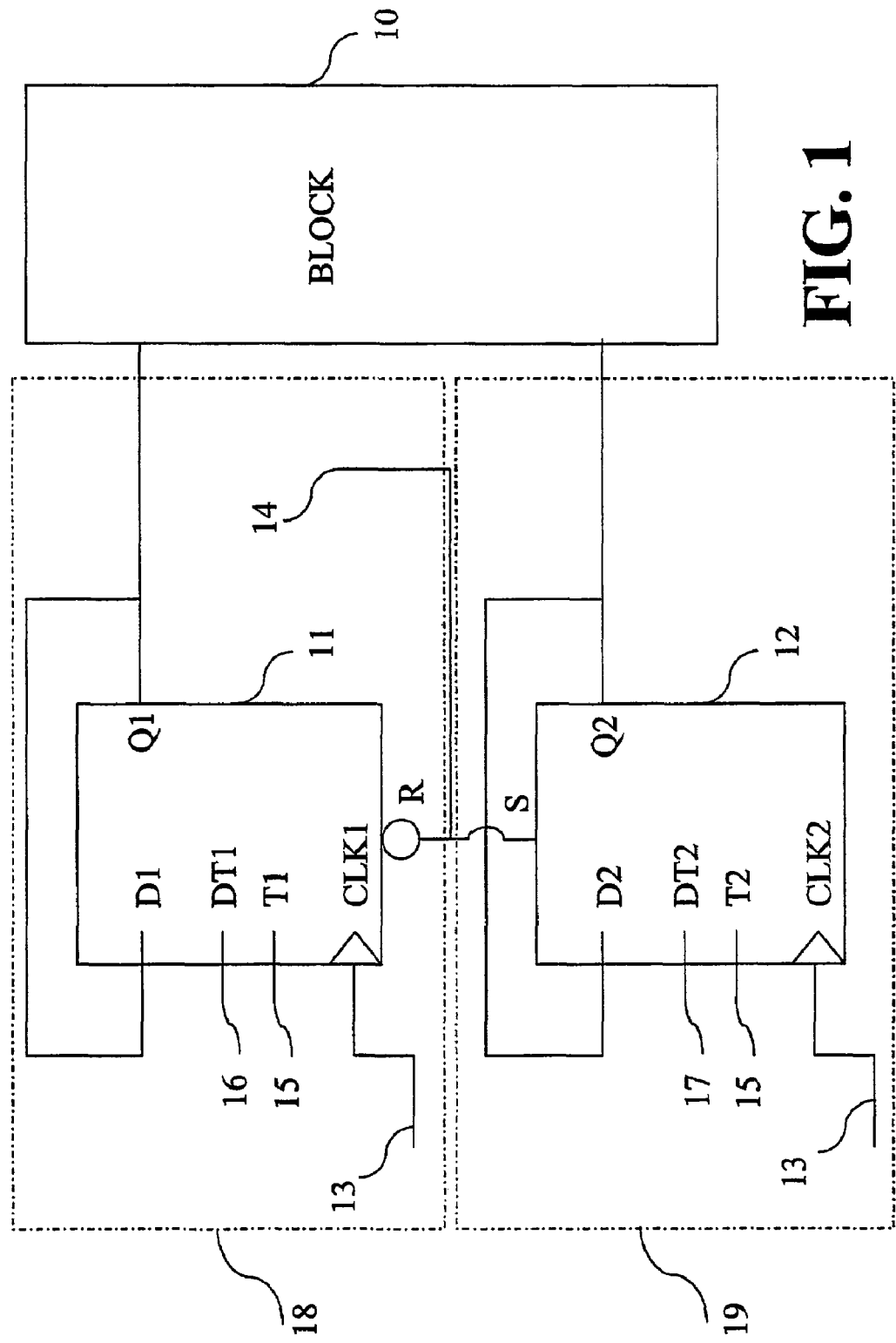
FIG. 1 is a block diagram illustrating an integrated circuit according to a first embodiment of a first object of the invention.

FIG. 1 illustrates an integrated circuit according to a first embodiment of the first object of the invention. Such a circuit comprises a block 10, which comprises essential elements of the integrated circuit, a first flipflop 11 and a second flipflop 12. Each flipflop has an operation input (D1, D2), a test input (DT1, DT2), a mode input (T1, T2), a clock input (CLK1, CLK2) and an output (Q1, Q2) connected to the operation input (D1, D2). A clock signal 13 permits to activate the clock inputs (CLK1, CLK2) and a mode signal 15 permits to control the mode inputs (T1, T2). The test input DT1 of the first flipflop 11 is intended to receive a first test signal 16 and the test input DT2 of the second flipflop 12 is intended to receive a second test signal 17. The first flipflop 11 comprises asynchronous reset-to-zero means R and the second flipflop 12 comprises asynchronous set-to-one means S. An initialization signal 14 permits to control these asynchronous reset-to-zero means R and set-to-one means S. The first flipflop 11 and its asynchronous reset-to-zero means R constitute a first cell 18. The second flipflop 12 and its asynchronous set-to-one means S constitute a second cell 19.

In the following of the discussion the various signals considered are logic signals. A "logic 0" corresponds to a zero voltage and a "logic 1" corresponds to a voltage equal to VDD, for example.

The block 10 can be divided into a combinatorial logic comprising logic circuits, and flipflops forming a test chain when the circuit is in the test mode. When the circuit is in the test mode, the first flipflop 11 and the second flipflop 12 are integrated with this test chain. The test consists of making the inputs of the combinatorial logic and of the flipflop vary and of observing the outputs of the combinatorial logic and of the flipflops resulting from such a variation of the inputs. Such test techniques are described, for example, in U.S. Pat. No. 5,574,853 filed Jan. 3, 1994.

It is notably an object of the test to verify whether points of the circuit are not "stuck" to a certain voltage because of a default during the manufacture of the integrated circuit. In order to obtain a proper testability of the circuit it must thus be possible to make the voltage vary of all the points of the circuit when the circuit is in the test mode. Thus, various test vectors are applied to the inputs of the combinatorial logic and of the flipflops in order to make all the points of the circuit vary. When a point has the value 0 whereas it should have the value 1 as a result of the test vector applied, it is said that this point of the circuit "sticks to 0".

When the integrated circuit of FIG. 1 is in the test mode, the mode signal 15 has the value 1. The effect of this is that the outputs Q1 and Q2 of the flipflops copy the values of the test inputs DT1 and DT2 at the rising edges of the clock signal 13. By sending various first test signals 16 and various second test signals 17 to the test inputs DT1 and DT2, the outputs Q1 and Q2 of the flipflops 11 and 12 can be varied in order to test them. Consequently, when the integrated circuit is in the test mode, the operation of the flipflops 11 and 12 is the same as that of the cell CMOS18 of the prior art.

When the integrated circuit of FIG. 1 is in the operation mode, the value of the mode signal 15 is 0. The effect of this is that the outputs Q1 and Q2 of the flipflops copy the values of the operation inputs D1 and D2 at the rising edges of the clock signal 13.

Let us consider the first flipflop 11. When the circuit changes to the operation mode, the initialization signal 14 is sent to the asynchronous reset-to-zero means R. This initialization signal 14 may be, for example, a slot whose effect is that the asynchronous reset-to-zero means R are triggered. The initialization signal 14 is thus dependent on the mode signal because such a slot is generated when the mode signal varies. For example, the initialization signal 14 may be derived from the mode signal by virtue of a circuit that has for an input the mode signal and is able to deliver a slot when its input has a falling edge. The initialization signal 14 may also be generated by a circuit comprising a memory for storing instants at which the circuit changes to the operation mode. When such instant happens, the circuit generates the initialization signal 14. As at this very instant the mode signal changes from 1 to 0, the initialization signal 14 is indeed dependent on the mode signal.

When the asynchronous reset-to-zero means R are triggered by the initialization signal 14, the effect of them is that output Q1 is changed to 0. The operation input D1 being connected to the output Q1, this operation input D1 also changes to 0. Consequently, if the clock signal 13 has a rising edge, the output Q1 remains 0, because it copies the operation input D1. If the clock signal 13 does not show a rising edge, the output Q1 also remains 0. Thus when the signal is in the operation mode, the output Q1 of the first flipflop 11 always remains 0 and is thus independent of the clock signal. It is thus possible to deactivate the clock signal 13 at the level of the clock input CLK1 when the circuit is in the operation mode. So this permits to reduce the power consumption of the first flipflop 11.

The output Q1 of the first flipflop 11 remaining at 0 when the circuit is in the operation mode, this output Q1 can replace ground at the points of the circuit that are to be connected to ground. Thus the first cell 18 has the same functions as the prior art CMOS18 cell, showing lower power consumption.

A similar reasoning is applied for the second flipflop 12. When the asynchronous set-to-one means S are triggered by the initialization signal 14, the effect of them is that the output Q2 changes to 1. This takes place when the circuit changes to the operation mode. Consequently, the output of the second cell Q2 retains the value 1, as long as the circuit is in the operation mode, independently of the clock signal 13. It is thus possible to deactivate the clock signal 13 at the level of the clock input CLK2 when the circuit is in the operation mode.

The output Q2 of the second flipflop 12 may thus replace the voltage VDD at the points of the circuit that must be connected to VDD. Thus the second cell 19 has the same functionalities as the prior-art cell CMOS18, while showing a lower power consumption.

Figure 2:
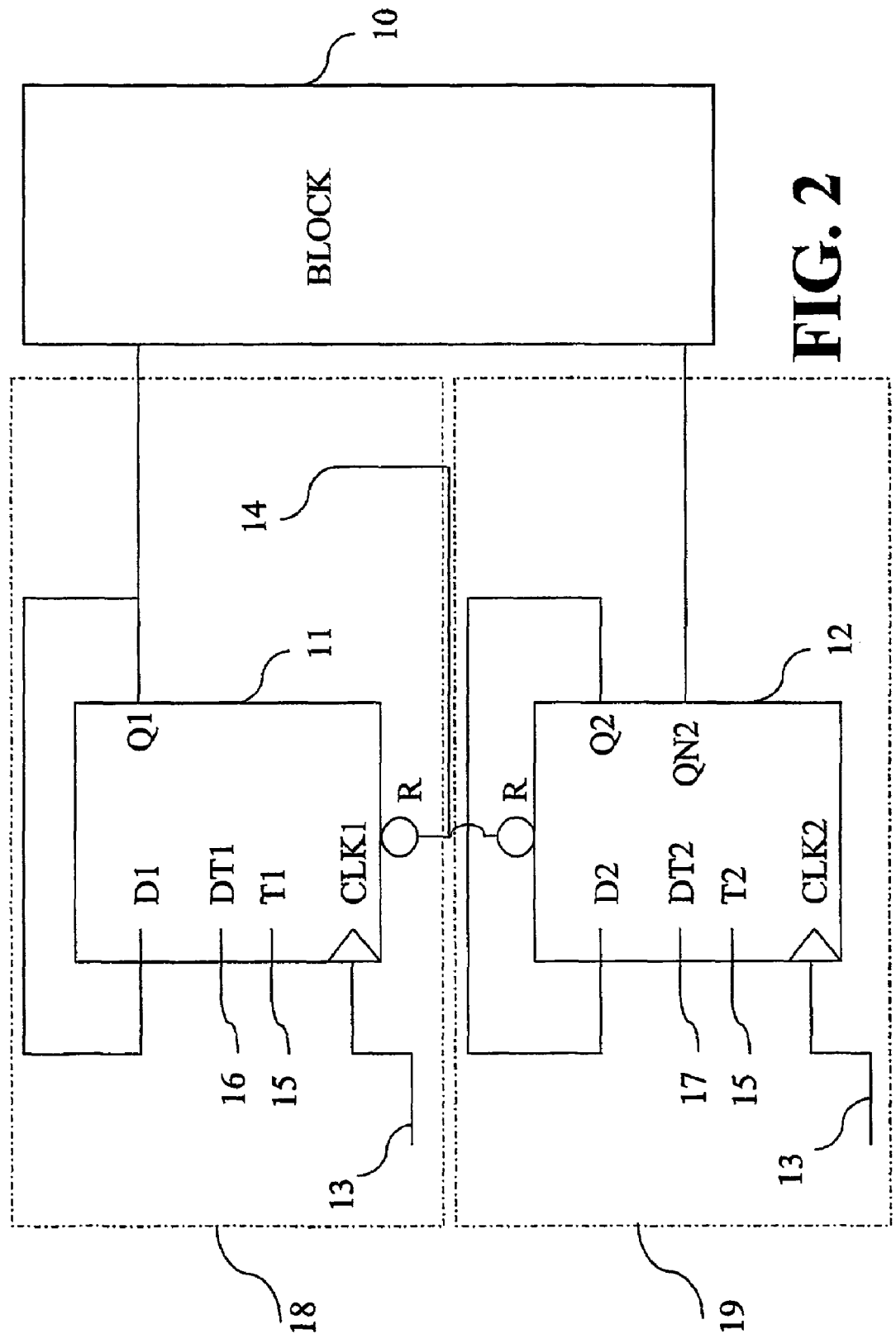
FIG. 2 is a block diagram illustrating another configuration of the integrated circuit of FIG. 1.

FIG. 2 shows another configuration which may be used in such a circuit. In this configuration the second flipflop 12 comprises, as does the first flipflop 11, asynchronous reset-to-zero means R. The second flipflop 12 has a first output Q2 and a second output QN2 which is complementary to the first, that is to say, when the first output Q2 has the value 0, the second output QN2 has the value 1 and vice versa.

By applying a similar reasoning to that applied in the description of FIG. 1, it is easy to find that the second output QN2 of the second flipflop 12 has the value 1 when the circuit is in the operation mode. Consequently, by taking the output QN2 of the second flipflop 12 for the output of the second cell 19, the output of the second cell 19 can replace the voltage VDD at the points of the circuit that must be connected to VDD. Thus, the second cell 19 has the same functionalities as the cell CMOS18 of the prior art, while showing a lower power consumption.

Other configurations are possible for implementing the invention. For example, for replacing ground, an output QN of a flipflop with asynchronous set-to-one means may be taken.

Figure 3:
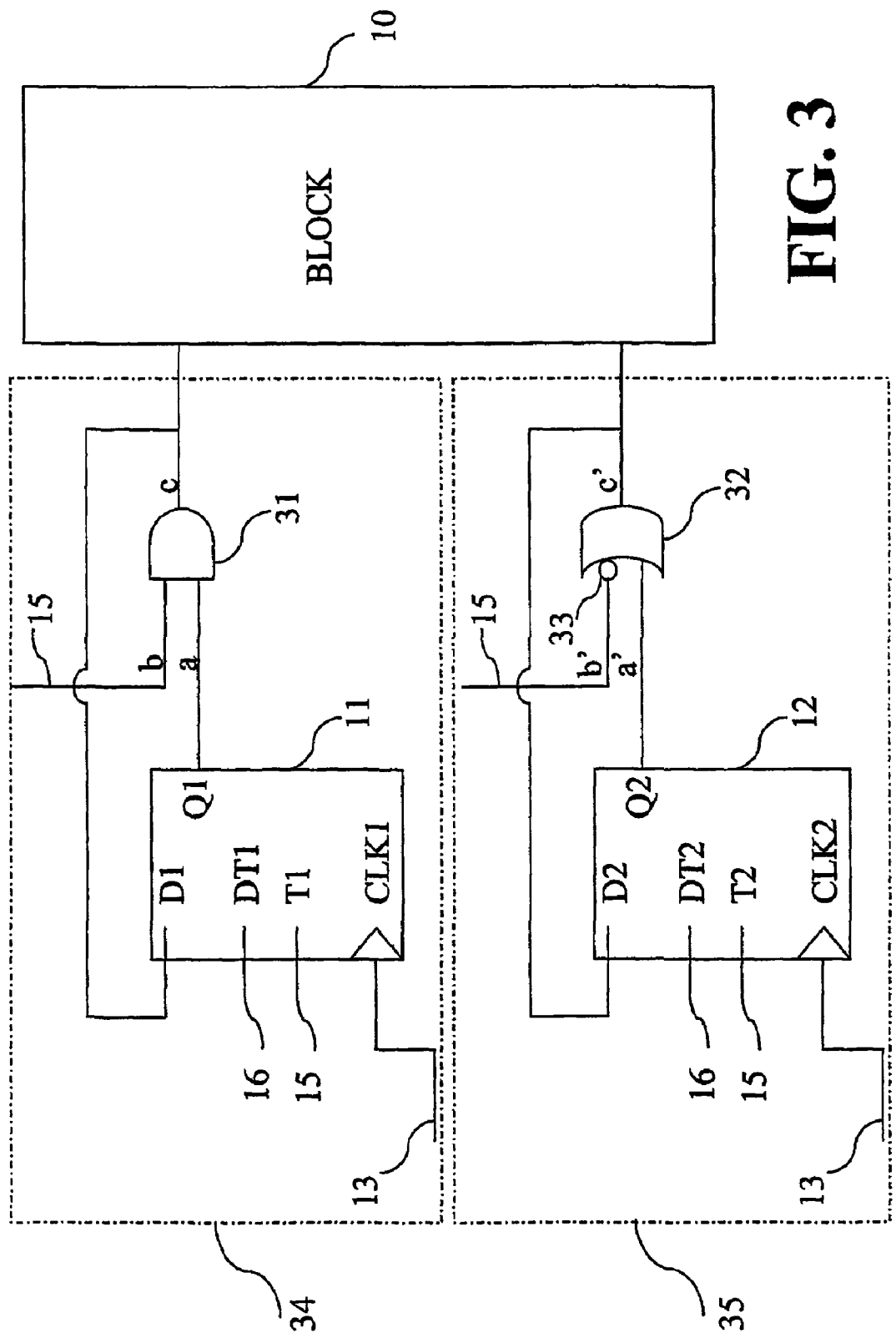
FIG. 3 is a block diagram illustrating an integrated circuit according to a second embodiment of the first object of the invention.

FIG. 3 illustrates an integrated circuit according to a second advantageous embodiment of the invention. Such a circuit comprises, in addition to certain elements already mentioned in FIG. 1, an AND gate 31, an OR gate 32 and an inverter 33.

The output Q1 of the first flipflop 11 is connected to a first input a of the AND gate 31. A second input b of the AND gate 31 is controlled by the mode signal 15. The operation input D1 of the first flipflop 11 is connected to the output c of the AND gate 31. The first flipflop 11 and the AND gate 31 form a third cell 34 which has the output c of the AND gate 31 for its output.

The output Q2 of the second flipflop 12 is connected to a first input a' of the OR gate 32. A second input of the OR gate 32 is controlled by the logical reciprocal of the mode signal 15 by virtue of the inverter 33. The operation input D2 of the second flipflop 12 is connected to the output c' of the OR gate 32. The second flipflop 12, the OR gate 32 and the inverter 33 form a fourth cell 35 which has the output c' of the OR gate 32 for its output. The OR gate 32 and the inverter 33 form a logic circuit.

When the integrated circuit is in the test mode, the operation of the flipflops 11 and 12 is the same as that described in detail in the description of FIG. 1. It should be observed that in the test mode certain points of this circuit cannot be tested. Actually, the second input b of the AND gate 31 as well as the input b' of the inverter 33 cannot be tested because they are controlled by the mode signal 15 which is fixed when the circuit is in the test mode. Thus in the case where the mode signal 15 has the value 1 as is the case in the integrated circuit of FIG. 1 when the circuit is in the test mode, it will not be possible to detect whether or not these two inputs b and b' are stuck to 1.

When the integrated circuit of FIG. 3 is in the operation mode, the mode signal 15 has the value 0. Consequently, it is easy to find that the output c of the AND gate 31 has the value 0 and that the output c' of the OR gate 32 has the value 1. This is independent of the outputs Q1 and Q2 of the first and second flipflops 11 and 12. Consequently, it is possible when the circuit is in the operation mode to deactivate the clock signal 13 at the level of the clock inputs CLK1 and CLK2. So this permits to reduce the power consumption at the flipflops 11 and 12.

The output c of the third cell 34 may replace ground at the points of the circuit that must be connected to ground and the output c' of the fourth cell 35 may replace the voltage VDD at the points of the circuit that must be connected to VDD. Thus, the third cell 34 and the fourth cell 35 have the same functionalities as the cell of the prior-art CMOS18 cell, showing lower power consumptions.

It will be noted that in certain integrated circuits the mode signal 15 has the value 1 and not 0 when the circuit is in the operation mode.

Figure 4:
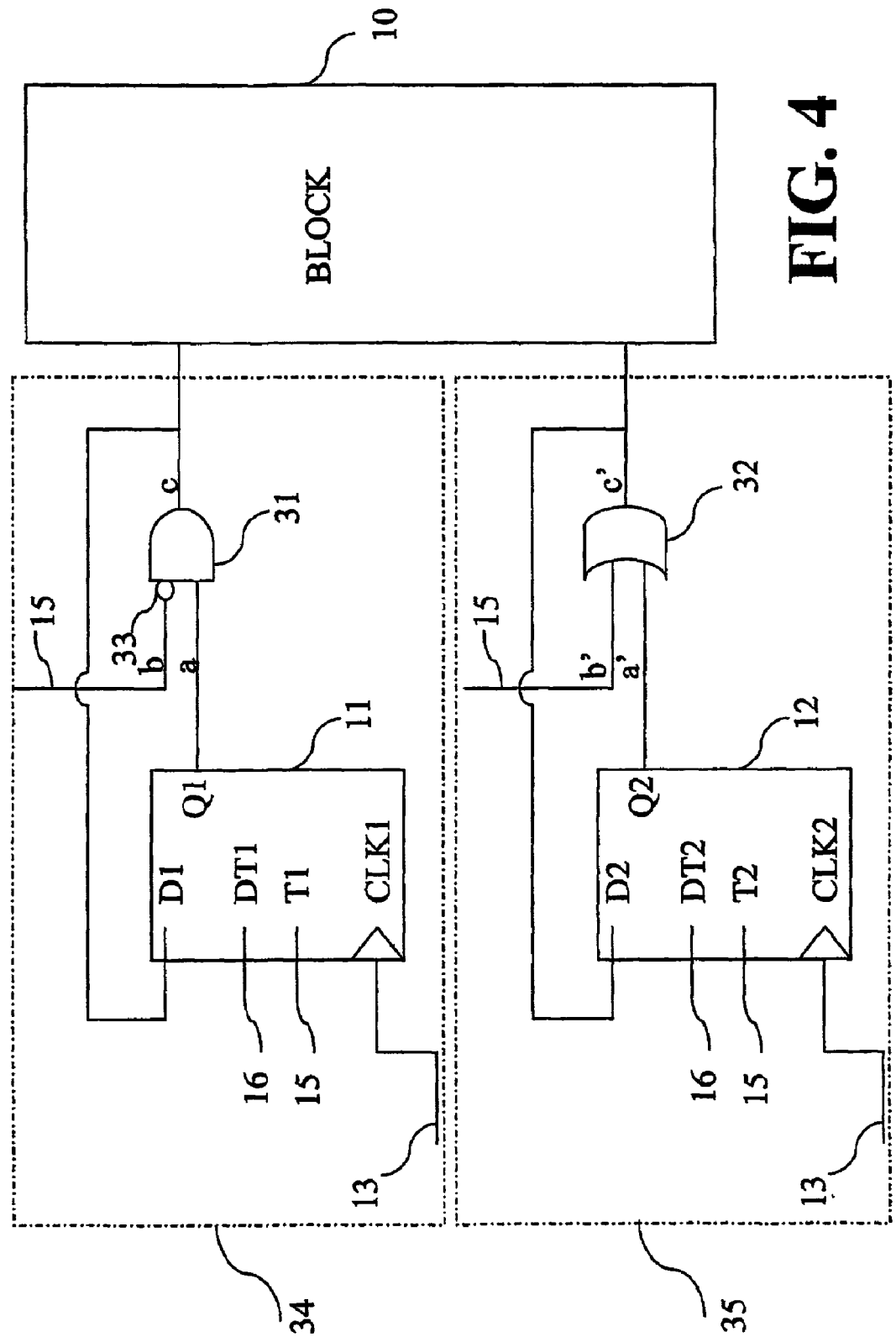
FIG. 4 is a block diagram illustrating a variant of the integrated circuit of FIG. 3.

FIG. 4 illustrates an embodiment of the circuit of FIG. 3 when the mode signal 15 has the value 1 in operation mode.

In this case the flipflops used are slightly different in order for the output (Q1, Q2) of a flipflop to copy the functional input (D1, D2) when the mode signal 15 has the value 1 and for the output (Q1, Q2) of a flipflop to copy the test input (DT1, DT2) when the mode signal 15 has the value 0. In this case the circuit of FIG. 3 may be modified so as to obtain an equivalent operation in the operation mode. To produce this, it is sufficient to take in each cell one logic circuit whose output only depends on the mode signal 15, as is done in the integrated circuit of FIG. 3. FIG. 4 shows a circuit which permits to obtain an operation that is equivalent to the circuit of FIG. 3 when the mode signal 15 has the value 1 in the operation mode. In the circuit of FIG. 4 the inverter 33 is found at the second input b of the AND gate 31, the second input b' of the OR gate 32 has no inverter.

Naturally, other logic circuits which may even be more complex can be used without leaving the scope of the invention.

By virtue of the circuit of FIG. 4 it is easy to find that the output c of the third cell 34 can replace ground at the points of the circuit which must be connected to ground and that the output c' of the fourth cell 35 can replace the voltage VDD at the points of the circuit that are to be connected to VDD. Thus, the third cell 34 and the fourth cell 35 have the same functionalities as the prior art CMOS18 cell, showing lower power consumptions.

Figure 5:
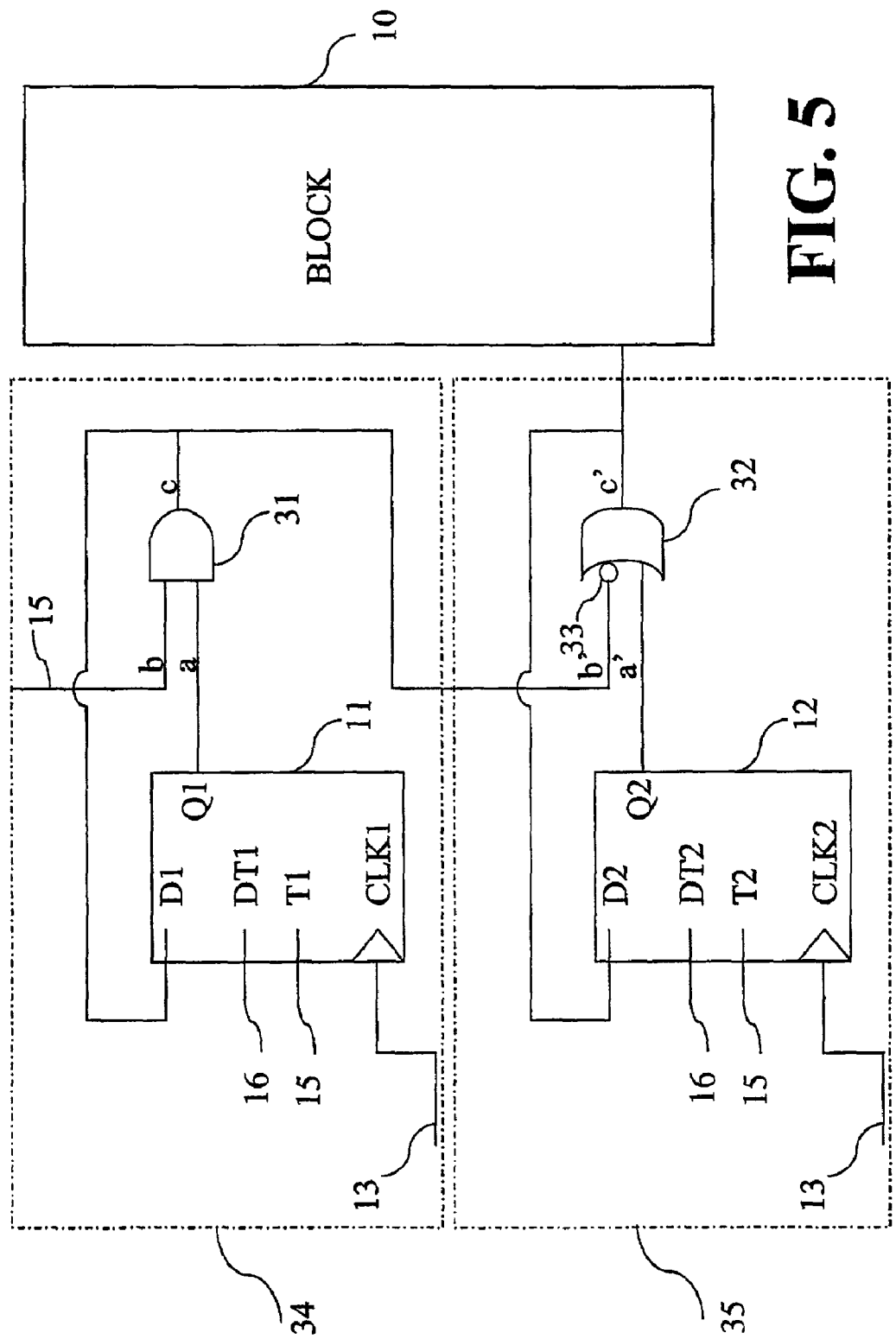
FIG. 5 is a block diagram illustrating an integrated circuit according to a second object of the invention.

FIG. 5 illustrates an integrated circuit according to a variant of the invention. In this circuit the output c of the third cell 34 is connected to the input b' of the inverter 33.

Let us consider the case where the mode signal 15 has the value 0 when the circuit is in the operation mode. In this case the output c of the AND gate 31 has the value 0 when the circuit is in the operation mode and, consequently, the output c' of the OR gate 32 has the value 1 when the circuit is in the operation mode. Thus, the output c' of the fourth cell 35 can replace the voltage VDD at the points of the circuit which must be connected to VDD.

If a cell is desired which permits to replace ground an AND gate substitutes for the inverter 33 and the OR gate 32.

The advantage of such a circuit resides in the fact that it comprises much fewer points that cannot be tested than the circuit of FIG. 3. Thus, whereas the input b' of the inverter 33 could not be tested in the circuit of FIG. 3, it can be tested in the circuit of FIG. 5. Actually, as was stated in the description of FIG. 1, it is possible to make the output Q1 of the first flipflop 11 vary when the circuit is in the test mode. Consequently, it is easy to find that it is possible to make the output c of the third cell 34 vary when the circuit is in the test mode. It is thus possible to test the input b' of the inverter 33.

Naturally it is possible to utilize various cells of the type of the fourth cell 35, able to deliver a zero voltage or a voltage equal to VDD when the circuit is in the operation mode. These cells comprise a logic circuit of which one of the inputs is connected to the output of their flipflop, and the other input is connected to the output of the third cell 34. Whatever the number of these cells, the integrated circuit will only comprise a single point that cannot be tested, which corresponds to the second input b of the AND gate 31 of the third cell 34.

It is also possible to utilize other types of cells instead of the third cell 34 of FIG. 5. Such a cell is to be able to deliver a fixed voltage when the circuit is in the operation mode, and is to have an output voltage that can be varied when the circuit is in the test mode. For example, one of the cells of the integrated circuit of FIG. 1 can be used. In this case all the points of the circuit can be tested because all the points of the cells of FIG. 1 can be tested.

The verb "to comprise" and its conjugations are to be interpreted in a broad sense, that is to say, as not excluding the presence not only of other elements than those listed after said verb, but also a plurality of elements already listed after said verb and preceded by the article "a" or "an".

The invention claimed is:

1. An integrated circuit comprising:
a cell having an output with a fixed output voltage when the integrated circuit is in an operation mode and having an input coupled to a control signal, the control signal depending on a mode signal that indicates whether the circuit is in the operation mode or in a test mode, said cell comprising a flip-flop and logic circuitry, responsive to the control signal, for setting the fixed output voltage when the circuit is in the operation mode, the flip-flop having an input coupled to the output of the cell; and
wherein said flip-flop is a D-type flip-flop having a first output, a second output and an asynchronous reset-to-zero or an asynchronous set-to-one controlled by the control signal, the first output or the second output corresponding to the output of the cell.

2. The integrated circuit as recited in claim 1, wherein said cell further includes a logic circuit which has a first input connected to an output of the flip-flop, a second input controlled by the mode signal and an output corresponding to the output of the cell, said logic circuit configured to deliver on its output a voltage as a function of said mode signal when the circuit is in the operation mode.

3. An integrated circuit comprising a first cell having an output with a fixed output voltage when the integrated circuit is in the operation mode; a second cell comprising a flip-flop and a logic circuit, said logic circuit having a first input connected to an output of the flip-flop, a second input connected to the output of the first cell and an output corresponding to the output of the second cell, and being able to deliver on its output a voltage as a function of the output voltage of the first cell when the circuit is in the operation mode, the flip-flop having an input coupled to the output of the second cell.

4. The integrated circuit of claim 3, wherein the first cell has an input coupled to a control signal, the control signal depending on a mode signal that indicates whether the circuit is in the operation mode or in a test mode, the first cell including another flip-flop and another logic circuit, the other flip-flop having a first input correspond to the input of the first cell, a second input coupled to the output of the first cell and an output, the other logic circuit having a first input connected to the output of the other flip-flop, a second input coupled to the mode signal and an output corresponding to the output of the first cell, the other logic circuit configured to deliver on its output a voltage as a function of the mode signal when the circuit is in the operation mode.

5. The integrated circuit of claim 3, wherein the output of the second cell has a fixed output voltage when the integrated circuit is in the operation mode, the fixed output voltage on the output of the second cell being different from the fixed output voltage on the output of the first cell.

6. The integrated circuit of claim 4, wherein the flip-flop and the other flip-flop are D-type flip-flops.

7. The integrated circuit of claim 1, wherein the flip-flop of the cell has the asynchronous reset-to-zero, the circuit further comprising another cell having an output with a fixed output voltage when the integrated circuit is in the operation mode and having an input coupled to the control signal, the other cell including a flip-flop, responsive to the control signal, being operable to set the fixed output voltage of the other cell when the circuit is in the operation mode, the flip-flop of the other cell having an input coupled to the output of the other cell, having an output corresponding to the output of the other cell, and having an asynchronous set-to-one coupled to the control signal.

8. The integrated circuit of claim 7, wherein the fixed output voltage of the cell is different from the fixed output voltage of the other cell.

9. The integrated circuit of claim 7, wherein the flip-flop of the other cell is a D-type flip-flop.

* * * * *